United States Patent
Kumar et al.

(10) Patent No.: US 8,816,748 B2
(45) Date of Patent: Aug. 26, 2014

(54) JITTER REDUCTION IN HIGH SPEED LOW CORE VOLTAGE LEVEL SHIFTER

(75) Inventors: Pankaj Kumar, Bangalore (IN); Pramod Parameswaran, Bangalore (IN); Makeshwar Kothandaraman, Bangalore (IN)

(73) Assignee: LSI Corporation, San Jose, CA (US)

( * ) Notice: Subject to any disclaimer, the term of this patent is extended or adjusted under 35 U.S.C. 154(b) by 87 days.

(21) Appl. No.: 13/494,188

(22) Filed: Jun. 12, 2012

(65) Prior Publication Data

US 2013/0328611 A1 Dec. 12, 2013

(51) Int. Cl.
*H03L 5/00* (2006.01)

(52) U.S. Cl.
USPC ............................. 327/333; 327/310; 327/589

(58) Field of Classification Search
USPC ............ 327/310, 327, 328, 333, 589; 326/68, 326/80, 81; 365/189.11
See application file for complete search history.

(56) References Cited

U.S. PATENT DOCUMENTS

| | | | |
|---|---|---|---|
| 7,443,223 B2 | 10/2008 | Bajkowski et al. | 327/333 |
| 7,592,850 B2 * | 9/2009 | Woo et al. | 327/333 |
| 7,671,657 B1 | 3/2010 | Chen et al. | 327/333 |
| 7,777,547 B2 | 8/2010 | Luo | 327/333 |
| 7,847,611 B2 | 12/2010 | Yang et al. | 327/333 |
| 2008/0048754 A1 | 2/2008 | Woo et al. | 327/333 |
| 2008/0136487 A1 | 6/2008 | Chen et al. | 327/333 |
| 2008/0303578 A1 | 12/2008 | Chen et al. | 327/333 |
| 2009/0066422 A1 | 3/2009 | Bartlett | 330/296 |
| 2009/0295362 A1 | 12/2009 | Douts et al. | 323/351 |
| 2010/0060339 A1 | 3/2010 | Chen et al. | 327/333 |
| 2011/0109369 A1 | 5/2011 | Benzer | 327/333 |
| 2011/0133823 A1 | 6/2011 | Kimura | 327/537 |
| 2012/0014192 A1 | 1/2012 | Patil et al. | 365/189.11 |

\* cited by examiner

*Primary Examiner* — Long Nguyen

(74) *Attorney, Agent, or Firm* — Christopher P. Maiorana, PC

(57) ABSTRACT

An apparatus comprising a level shifter circuit and a control circuit. The level shifter circuit may be configured to generate a differential output in response to (i) a first differential input, (ii) a second differential input and (iii) a first supply. The level shifter circuit comprises a first pull down transistor pair operating with the first supply. The control circuit may be configured to generate the second differential input in response to (i) the first differential input and (ii) a second supply. The control circuit generally comprises a second pull down transistor pair operating with the second supply. The first supply has a higher voltage than the second supply.

17 Claims, 7 Drawing Sheets

US 8,816,748 B2

JITTER REDUCTION IN HIGH SPEED LOW CORE VOLTAGE LEVEL SHIFTER

FIELD OF THE INVENTION

The present invention relates to level shifter circuits generally and, more particularly, to a method and/or apparatus for implementing jitter reduction in high speed low core voltage level shifter operating in a noisy environment.

BACKGROUND OF THE INVENTION

Conventional level shifters have been found to be a major source of jitter in IO cells. Conventional level shifters are triggered by a core voltage pull down device. As process technologies scale down, core voltages are also scaling down. However, threshold voltages of core devices do not have a similar factor for scaling down. Pull down capability of conventional level shifters is limited at lower core voltages used in newer process technologies, particularly in the presence of noise.

It would be desirable to implement jitter reduction in a high speed low core voltage level shifter when noise is present on the core supply voltage.

SUMMARY OF THE INVENTION

The present invention concerns an apparatus comprising a level shifter circuit and a control circuit. The level shifter circuit may be configured to generate a differential output in response to (i) a first differential input, (ii) a second differential input and (iii) a first supply. The level shifter circuit comprises a first pull down transistor pair operating with the first supply. The control circuit may be configured to generate the second differential input in response to (i) the first differential input and (ii) a second supply. The control circuit generally comprises a second pull down transistor pair operating with the second supply. The first supply has a higher voltage than the second supply.

The objects, features and advantages of the present invention include providing a level shifter that may (i) provide jitter reduction, (ii) operate at high speeds, (iii) operate at a low core voltage and/or (iv) provide a scalable solution when implementing a level shifter.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
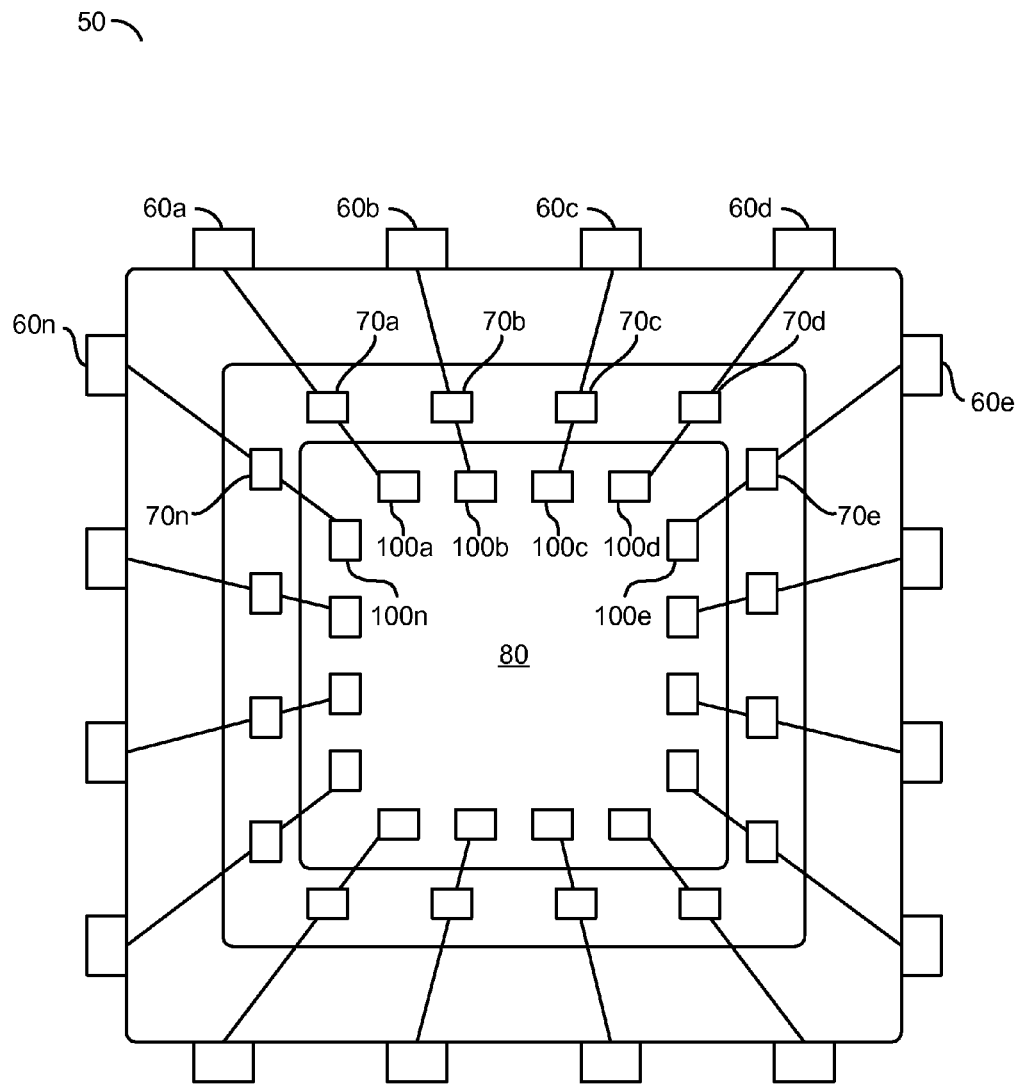
FIG. 1 is a diagram of a context of an embodiment of the invention.

Referring to FIG. 1, a block diagram of a circuit 50 is shown illustrating a context of an embodiment of the invention. The circuit 50 generally comprises a plurality of devices (or circuits) 60a-60n, a plurality of devices (or circuits) 70a-70n, a block (or circuit) 80, and a plurality of devices (or circuits) 100a-100n. In one example, the devices 60a-60n may be implemented as pins connected to a package of an integrated circuit (IC). The devices 70a-70n may be implemented as bond pads. The bond pads 70a-70n may be connected to the pins 60a-60n through a lead frame. The pads 70a-70n may be connected to the circuits 100a-100n through a plurality of bond wires. The circuit 80 may be implemented as a core circuit. The circuits 100a-100n may be implemented as a number of level shifter circuits. Each of the circuits 100a-100n may be configured to provide level shifting between two supply voltages. While a number of circuits 100a-100n are shown, in one example, one or more of the pads 70a-70n may pass through one of the circuits 100a-100n. In another example, a 1:1 ratio between the pads 70a-70n and the circuits 100a-100n may be implemented. In yet another example, a number of the circuits 100a-100n may be implemented, then a larger number of pads 70a-70n may be implemented. The particular number of pads 70a-70n and the particular number of the circuits 100a-100n may be varied to meet the design criteria of a particular implementation.

Figure 2:
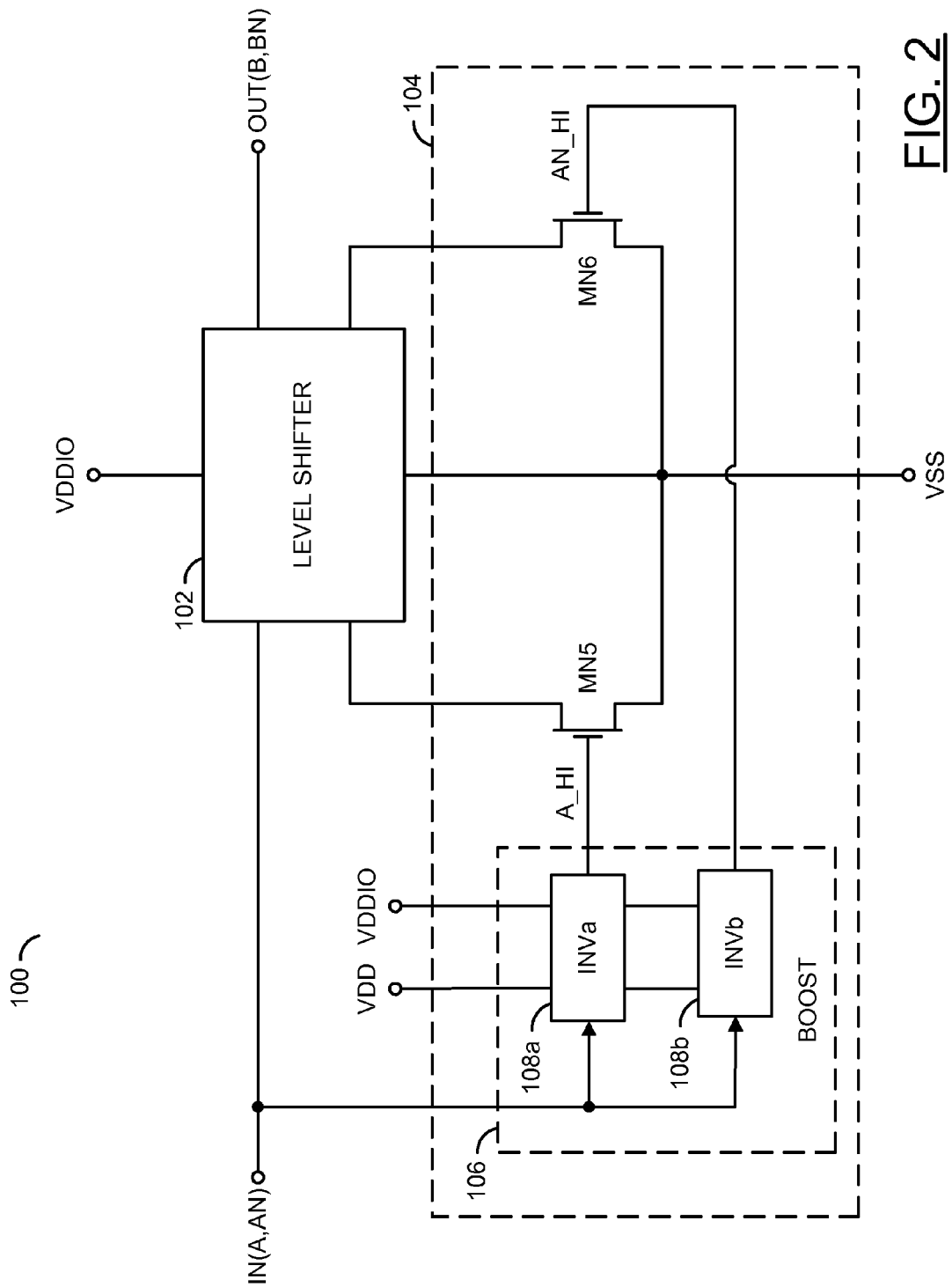
FIG. 2 is a diagram of an embodiment of the invention.

Referring to FIG. 2, a diagram of a circuit 100 is shown illustrating an embodiment of the invention. The circuit 100 generally comprises a block (or circuit) 102, and a block (or circuit) 104. The circuit 102 may be implemented as a level shifter circuit. The circuit 104 may be implemented as a control circuit. The circuit 104 generally comprises a block (or circuit) 106, and a device (or circuit) MN5, and a device (or circuit) MN6. The circuit 106 generally comprises a block (or circuit) 108a and a block (or circuit) 108b. The circuit 106 may be implemented as a boost circuit. The circuits 108a and 108b may be implemented as inverter circuits (to be described in more detail in connection with FIG. 4). The device MN5 may be implemented as a transistor. The device MN6 may be implemented as a transistor.

The circuit 102 may operate using an input/output supply voltage (e.g., VDDIO) configured to operate with an input/output pad. The supply voltage VDDIO may be in the range of 1.8 volts. In one example, the supply voltage VDDIO may vary by +/−10%. While a 1.8 volt supply has been described, other supply voltages, such as 1.5 volts, 1.35 volts, etc., may be implemented to meet the design criteria of a particular implementation. For example, the supply voltage VDDIO may be dependent on the particular specification of the device connected to the circuit 100. The circuit 108a and the circuit 108b may receive the supply voltage VDDIO as well as a second supply voltage (e.g., VDD). The supply voltage VDD may be implemented, in one example, as a 0.85 volt supply voltage. The supply voltage VDD may vary by +/−10%. While a 0.85 volt supply has been described, other core supply voltages, such as 0.9 volts may be implemented to meet the design criteria of a particular implementation.

The supply voltage VDD may depend on the particular process used to implement the core. The supply voltage VDD may operate at a voltage lower than the supply voltage VDDIO. The circuit 102 and the circuit 106 may receive a signal IN. The signal IN may be a differential signal (e.g., a signal A and a complement signal AN). The circuit 102 may generate a signal OUT. The signal OUT may be a differential signal comprising a signal B and a complement signal BN. The circuit 108a may generate a signal (e.g., A_HI) in response to the signal A, the supply voltage VDD and the supply voltage VDDIO. The signal A_HI may be used to control the transistor MN5 to provide a pull down. The circuit 108b may have a similar operation used to generate the signal (e.g., AN_HI) presented to the transistor MN6.

Figure 3:
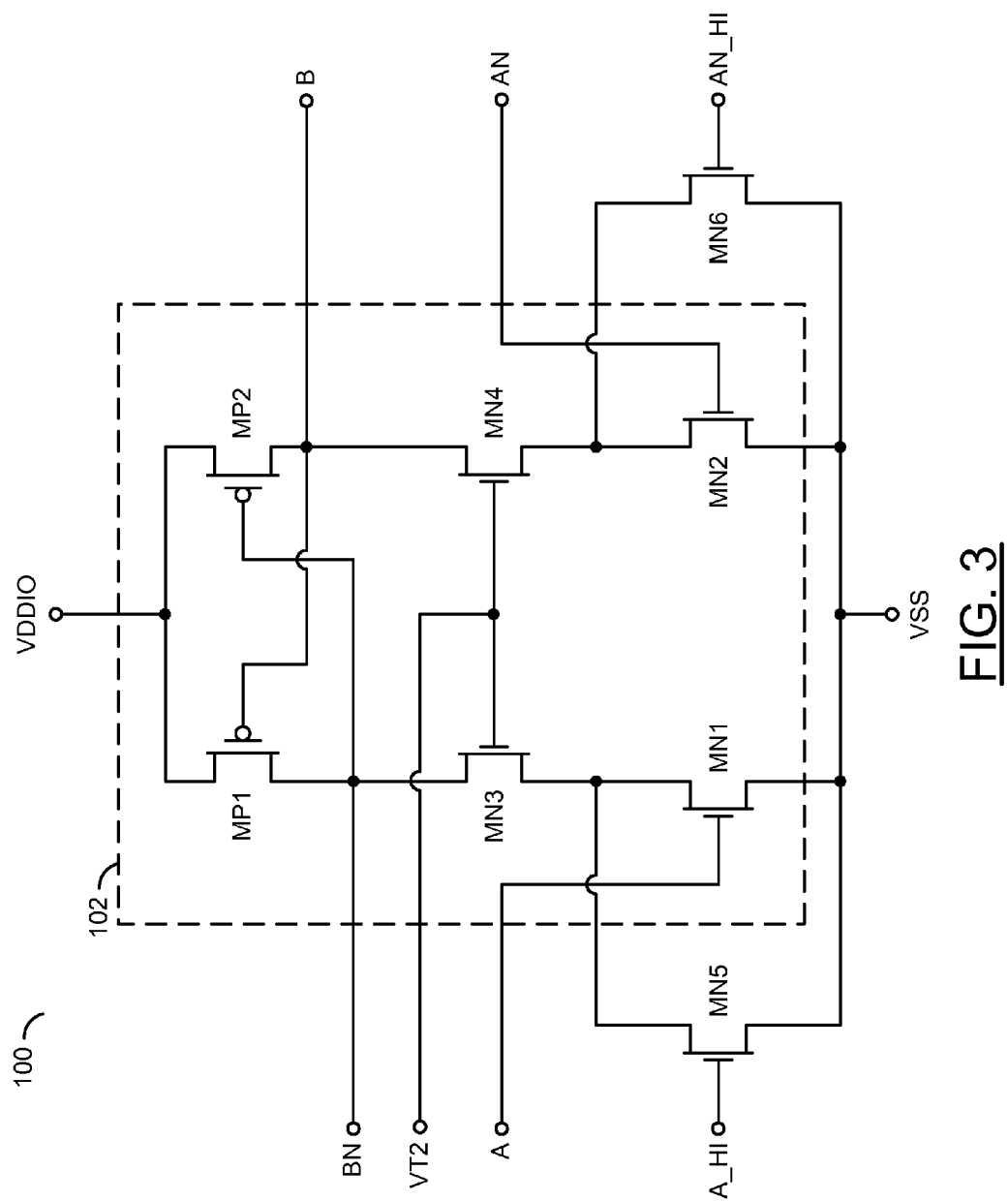
FIG. 3 is a more detailed diagram of the circuit of FIG. 1.

Referring to FIG. 3, a more detailed diagram of a circuit 102 is shown. The circuit 102 generally comprises a block (or circuit) MP1, a block (or circuit) MP2, a block (or circuit) MN3, a block (or circuit) MN4, a block (or circuit) MN1, a block (or circuit) MN2. The transistor MP1 and the transistor MP2 may be loads. The transistor MN3 and the transistor MN4 may share a common gate that receives a signal (e.g., VT2). The signal VT2 may be selected to control the transistors MN3 and MN4. The selection of the signal VT2 may control the amount (or level) of voltage shifting. The signal VT2 may be generated in a number of ways (to be described in more detail in connection with FIG. 4). The signal VT2 may be generated at a level to meet one or more guidelines (or specifications) when converting voltages in order to protect the core devices MN1 and/or MN2. For example, 1.8 volt devices may be interfaced with 3.3 volt devices. Such a voltage level conversion may be controlled by the signal VT2.

The circuit MN1 may receive the signal A. The signal MN2 may receive the signal AN. The device MP1 and the device MP2 may be implemented, in one example, as P-channel transistors. The devices MN1, MN2, MN3 and MN4 may be implemented, in one example, as N-channel transistors. The particular type of transistor implemented may be varied to meet the design criteria of a particular implementation. The transistor MN1 may operate in parallel with the transistor MN5. The transistor MN2 may operate in parallel with the transistor MN6. The transistor MN1 and the transistor MN2 may be implemented as core devices operating using the supply voltage VDD. The transistor MN1 may receive the signal A. The transistor MN5 may receive the signal A_HI, which may be used to provide a pull down using the core supply voltage VDDIO. The transistor MN2 may receive the signal AN. The transistor MN6 may receive the signal AN_HI, which may be used to provide a pull down.

Figure 4:
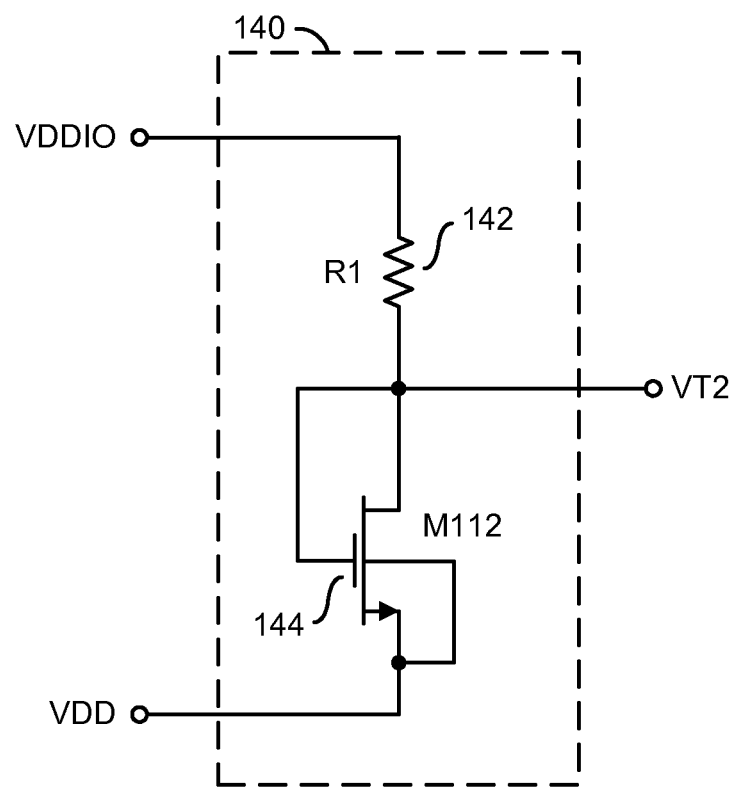
FIG. 4 is a diagram of a circuit used to generate one of the signals of FIG. 2.

Referring to FIG. 4, a diagram of a circuit 140 is shown. The circuit 140 may be used to generate the signal VT2. The circuit 140 generally comprises a resistor 142 and a transistor 144. The resistor 142 may have a value of 1KΩ. However, the particular size of the transistor 142 may be varied to meet the design criteria of the particular implementation. The signal VT2 may be generated by dividing the voltages VDDIO and VDD using the resistor 142 and the transistor 144.

Figure 5:
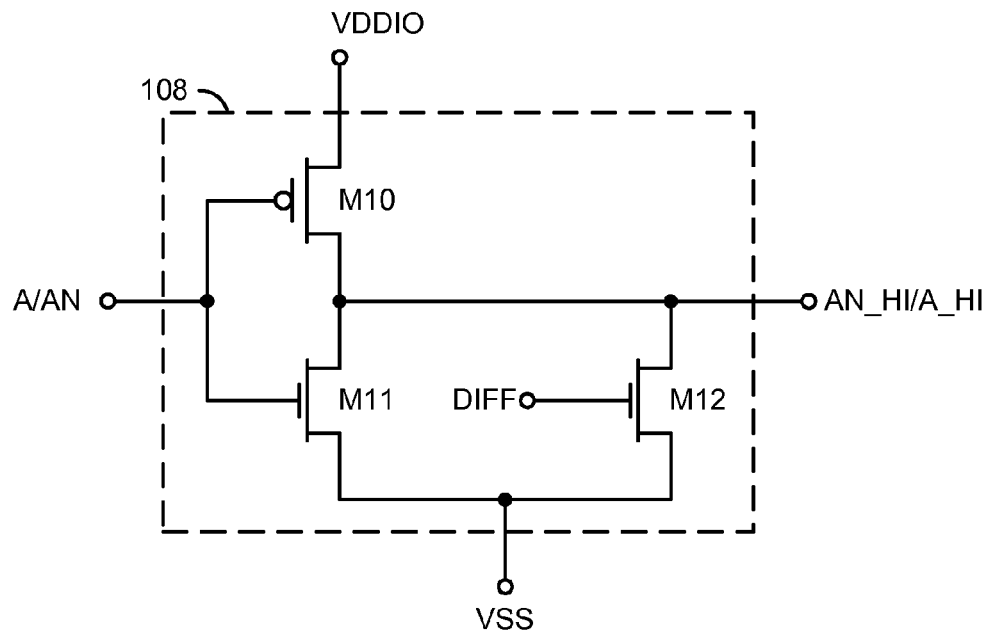
FIG. 5 is a diagram of a circuit used to generate one of the signals of FIG. 2.

Referring to FIG. 5, a diagram of the circuit 108 used to generate an IO voltage is shown. The circuit 108 generally comprises a transistor M10, a transistor M11 and a transistor M12. The transistors M10 and M11 generally operate using the supply voltage VDDIO. The transistor M12 may receive a signal (e.g., DIFF) (to be described in more detail in connection with FIG. 5). The transistor M12 may provide a pull down using the supply voltage VDD.

Figure 6:
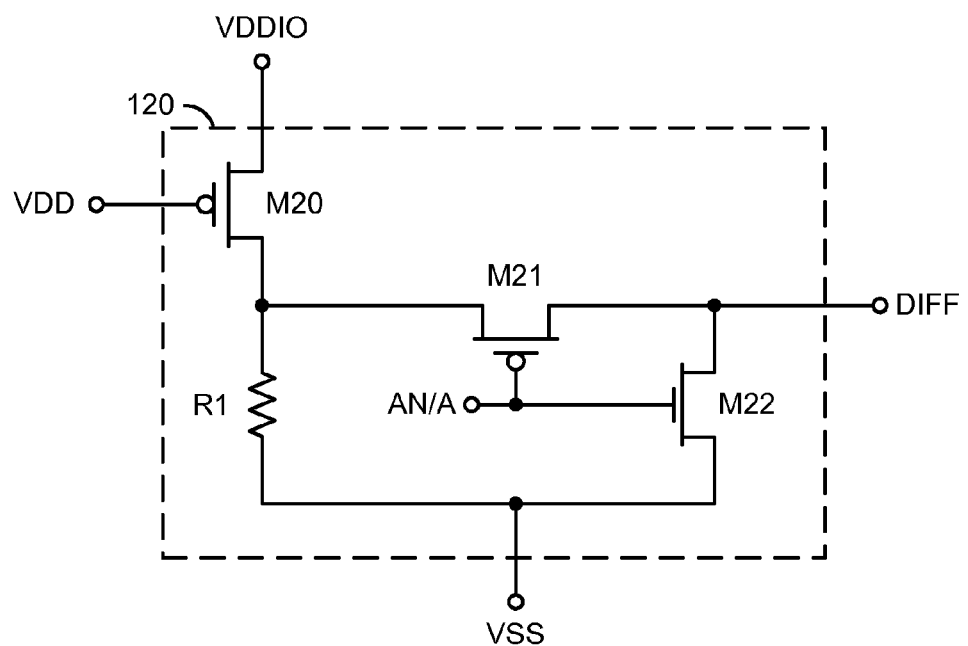
FIG. 6 is a diagram of a circuit used to generate one of the signals of FIG. 5.

Referring to FIG. 6, a diagram of a circuit 120 used to generate the signal DIFF is shown. The circuit 120 generally comprises a transistor M20, a transistor M21 and a transistor M22 and a resistor R1. The transistor M20 may have a source that receives the supply voltage VDDIO and a gate that receives the supply voltage VDD. The transistor M21 may have a gate that receives the signal A (for the circuit 108a) or the signal AN (for the circuit 108b). The signal A (or AN) may also be presented to a gate of the transistor M22. A drain of the transistor M21 and a source of the transistor M22 may be connected to provide the signal DIFF.

The level shifter circuit 102 may be triggered by the core voltage VDD. The core voltage VDD is normally reduced in each new process technology without a corresponding change in the core device threshold voltage. Without the transistors MN5 and MN6, delay from the level shifter 100 may increase, as the core supply VDD decreases. Such delay may increase even further when noise is present on the core supply voltage VDD. As the delay increases, jitter also increases. The devices MN5 and MN6 may be used to reduce such delay. The devices MN5 and MN6 may be triggered by IO level signals. The IO level signal generation is discussed in more detail in connection with FIGS. 4 and 5. When the primary core voltage VDD is low (or noisy), the devices MN5 and MN6 generally control the level shifter circuit 102 to trigger and/or limit the delay. Limiting the delay improves jitter performance.

The level shifter circuit 102 may use a cross coupled structure. The level shifter 102 may react first while pulling down. The devices MN1 and MN2 are core level transistors. In one example technology, the lowest core voltage may be in the range of 0.765V. In a simulation with noise of +/−50 mV on VSS, the pull down capability of the devices MN1 and MN2 may be affected, sometimes in the range of a 2× increase in delay, which increases jitter value. By implementing the devices MN5 and MN6 in addition to the level shifter circuit 102, the jitter performance may be improved.

In general, the devices MN5 and MN6 may be implemented as IO devices. The signal A_HI and the signal AN_HI may be implemented as IO level signals, which are normally in phase with the signal A and the signal AN respectively. When the signal A_HI and the signal AN_HI are generated, the level shifter 102 pulls down with the IO level signals A and AN, which normally removes core voltage dependency. In the case of noise on the supply VDD (or on VSS), the devices MN1 and MN2 have a strength reduced due to a low Vgs, and delay may continue to increase. The devices MN5 and MN6 may be used to obtain data within a certain delay parameter tolerance, and may take over the discharging action of the level shifter 102 from core devices MN1 and/or MN2. Hence, the delay is limited and thus jitter is also limited.

One example of generating IO level voltage for pull-down devices is shown in FIGS. 5 and 6. One inverter stage may be implemented, with a core level input and/or an IO level output. When a significant difference between the supply voltage VDD and the supply voltage VDDIO is present, the additional pull-down from the devices MN5 and MN6 is generally needed. With the circuit 100, the inverters 108a and 108b may create a stable operation when a significant difference between the supply voltage VDD and the supply voltage VDDIO is present (e.g., 1.5×-2.5×, etc.).

Figure 7:
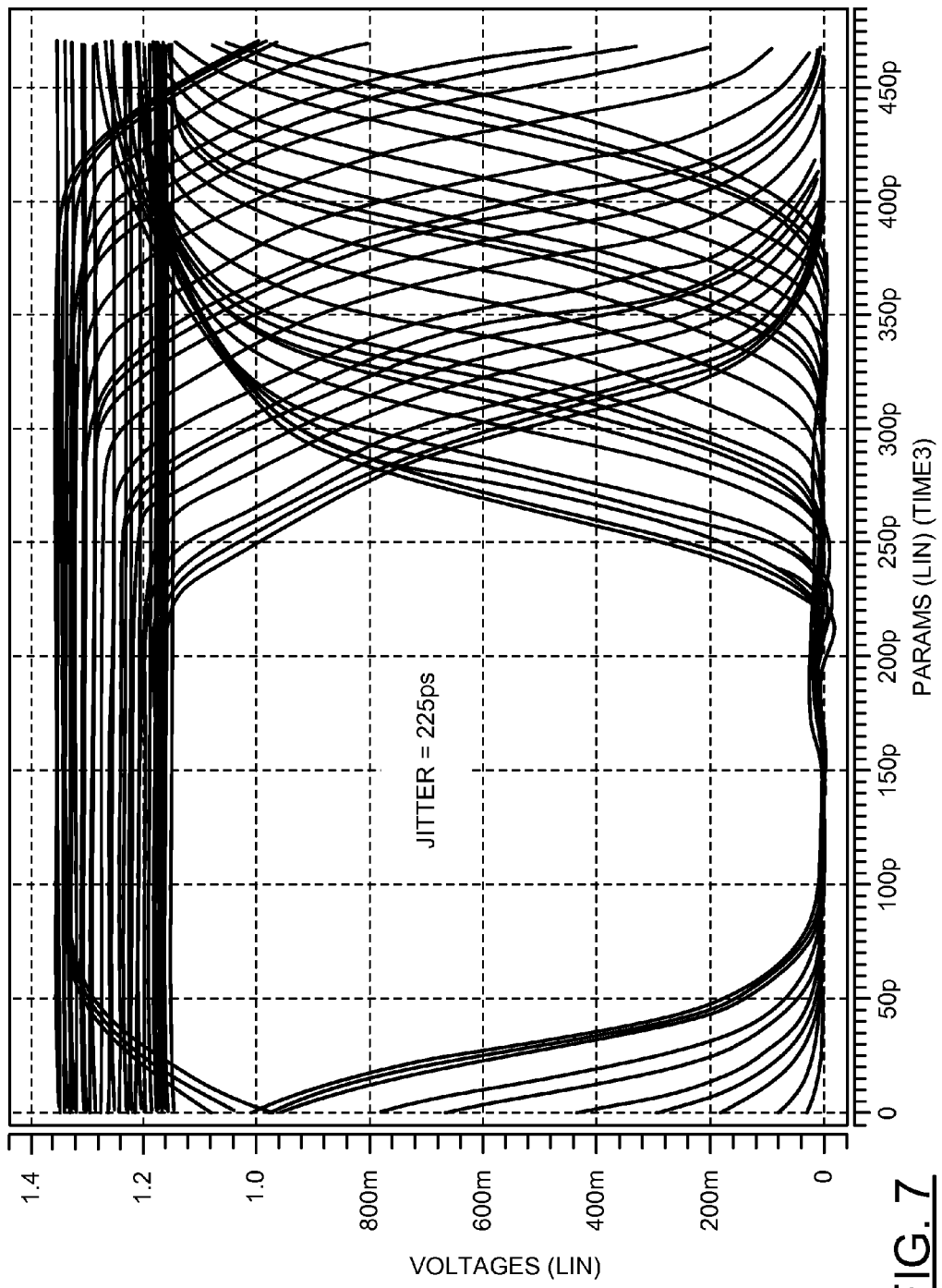
FIG. 7 is a plot of a conventional level shifter.
Figure 8:
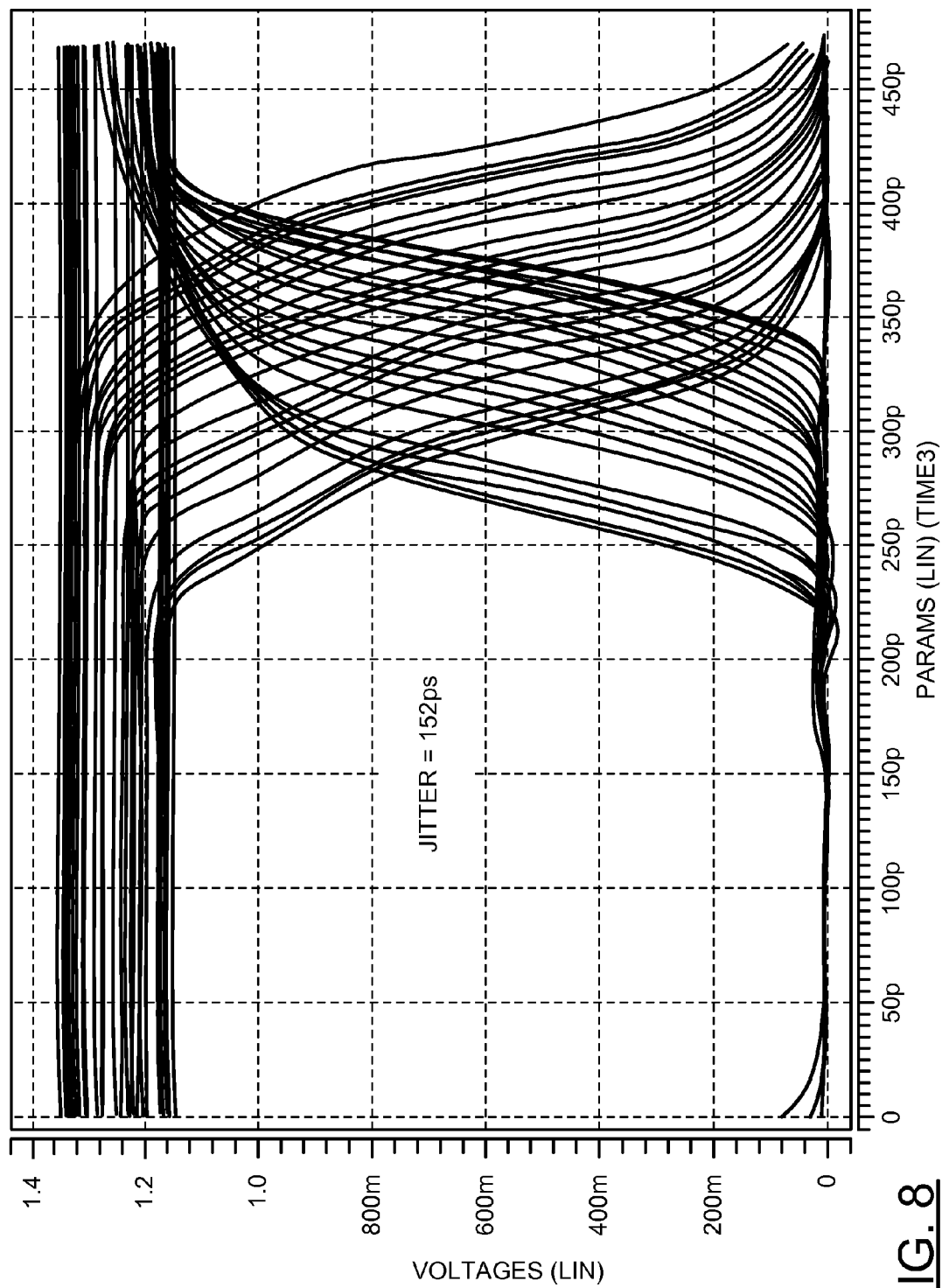
FIG. 8 is a plot of a level shifter implementing the present invention.

Referring to FIGS. 7 and 8, a plot showing the improvement in jitter by introducing new devices in existing level shifter architecture is shown. In FIG. 7, the jitter parameter may be 225 ps. FIG. 7 shows an implementation without the transistors MN5 and MN6. In FIG. 8, the jitter parameters shown are reduced to approximately 152 ps. FIG. 8 is a simulation with the implementation of the transistors MN5 and MN6. While a jitter reduction from 225 ps to 152 ps is shown, the particular amount of jitter reduction provided by the circuit 100 may vary according to a number of design parameters.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

The present invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more integrated circuits, one or more chips or die arranged as flip-chip modules and/or multi-chip modules or by interconnecting an appropriate network of conventional component circuits, as is described herein, modifications of which will be readily apparent to those skilled in the art(s).

While the invention has been particularly shown and described with reference to the preferred embodiments thereof, it will be understood by those skilled in the art that various changes in form and details may be made without departing from the scope of the invention.

The invention claimed is:

1. An apparatus comprising:
   a level shifter circuit configured to generate a differential output in response to (i) a first differential input, (ii) a second differential input and (iii) a first supply, wherein said level shifter circuit comprises (a) a first transistor pair operating with said first supply, (b) a second transistor pair configured to receive a control signal, and (c) a third transistor pair connected between said second transistor pair and said first supply; and
   a control circuit configured to generate said second differential input in response to (i) said first differential input and (ii) a second supply, wherein (A) said control circuit comprises a fourth transistor pair operating with said second supply, (B) said first supply has a higher voltage than said second supply, (C) said first transistor pair and said fourth transistor pair operate as pull down devices, and (D) said control signal controls a conversion between said first supply and said second supply to protect said first transistor pair from said first supply.

2. The apparatus according to claim 1, wherein said control circuit further comprises:
   a boost circuit configured to control said fourth transistor pair.

3. The apparatus according to claim 2, wherein said boost circuit comprises a first stage configured to generate a signal presented to said first transistor pair and a second stage configured to generate a signal presented to said fourth transistor pair.

4. The apparatus according to claim 1, wherein said control circuit reduces jitter on said differential output.

5. The apparatus according to claim 1, wherein said third transistor pair comprise IO level devices.

6. The apparatus according to claim 1, wherein said first transistor pair comprise core level devices.

7. The apparatus according to claim 1, wherein said apparatus reduces a jitter parameter on said differential output during noisy conditions.

8. The apparatus according to claim 7, wherein said control circuit reduces said jitter parameter independently of said level shifter circuit.

9. The apparatus according to claim 1, wherein said higher voltage of said first supply is around 1.5 times as high as said second supply.

10. The apparatus according to claim 1, wherein said apparatus is scalable to provide a variable amount of level shifting.

11. The apparatus according to claim 1, wherein said control circuit operates in parallel with said level shifter circuit.

12. The apparatus according to claim 1, wherein said apparatus is implemented as one or more integrated circuits.

13. An apparatus comprising:
   means for generating a differential output in response to (i) a first differential input, (ii) a second differential input and (iii) a first supply, wherein said differential output is generated using (a) a first transistor pair operating with said first supply, (b) a second transistor pair configured to receive a control signal, and (c) a third transistor pair connected between said second transistor pair and said first supply; and
   means for generating said second differential input in response to (i) said first differential input and (ii) a second supply, wherein (A) said second differential input is generated using a fourth transistor pair operating with said second supply, (B) said first supply has a higher voltage than said second supply, (C) said first transistor pair and said fourth transistor pair operate as pull down devices, and (D) said control signal controls a conversion between said first supply and said second supply to protect said first transistor pair from said first supply.

14. A method for reducing jitter in a level shifter, comprising the steps of:
   generating a differential output in response to (i) a first differential input, (ii) a second differential input and (iii) a first supply, wherein said differential output is generated using (a) a first transistor pair operating with said first supply, (b) a second transistor pair configured to receive a control signal, and (c) a third transistor pair connected between said second transistor pair and said first supply; and
   generating said second differential input in response to (i) said first differential input and (ii) a second supply, wherein (A) said second differential input is generated using a fourth transistor pair operating with said second supply, (B) said first supply has a higher voltage than said second supply, (C) said first transistor pair and said fourth transistor pair operate as pull down devices, and (D) said control signal controls a conversion between said first supply and said second supply to protect said first transistor pair from said first supply.

15. The method according to claim 14, wherein said method reduces jitter on said differential output.

16. The method according to claim 15, wherein said method reduces a jitter parameter on said differential output during noisy conditions.

17. The method according to claim 14, wherein said higher voltage of said first supply is around 1.5 times as high as said second supply.

* * * * *